United States Patent
Hünermann et al.

(10) Patent No.: US 10,287,705 B2
(45) Date of Patent: May 14, 2019

(54) PULLING A SEMICONDUCTOR SINGLE CRYSTAL ACCORDING TO THE CZOCHRALSKI METHOD AND SILICA GLASS CRUCIBLE SUITABLE THEREFOR

(71) Applicant: Heraeus Quarzglas GmbH & Co. KG, Hanau (DE)

(72) Inventors: Michael Hünermann, Alzenau (DE); Thomas Kayser, Leipzig (DE); Walter Lehmann, Leipzig (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 15/833,429

(22) Filed: Dec. 6, 2017

(65) Prior Publication Data

US 2018/0112327 A1    Apr. 26, 2018

Related U.S. Application Data

(63) Continuation of application No. 14/430,868, filed as application No. PCT/EP2013/069234 on Sep. 17, 2013, now Pat. No. 9,856,576.

(30) Foreign Application Priority Data

Sep. 27, 2012    (DE) .................. 10 2012 109 181

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01); *Y10T 117/1032* (2015.01)

(58) Field of Classification Search
CPC ............................. C30B 15/02; C30B 15/10
See application file for complete search history.

(56) References Cited

U.S. PATENT DOCUMENTS

| 6,548,131 B1 | 4/2003 | Fabian et al. |
| 7,587,912 B2 | 9/2009 | Ohama et al. |

(Continued)

FOREIGN PATENT DOCUMENTS

| DE | 199 17 288 A1 | 10/2000 |
| DE | 10 2007 015 184 A1 | 10/2007 |

(Continued)

OTHER PUBLICATIONS

Espacenet English Language Abstract, DE 199 17 288 C2, published Jun. 28, 2001.

(Continued)

*Primary Examiner* — Robert M Kunemund
(74) *Attorney, Agent, or Firm* — Tiajoloff & Kelly LLP

(57) ABSTRACT

In a known method for pulling a semiconductor single crystal according to the Czochralski method, a semiconductor melt is produced in a silica glass crucible and the semiconductor single crystal is pulled from said melt. The inner wall of the silica glass crucible and the exposed melt surface are in contact with one another and with a respective melt atmosphere in the region of a contact zone running radially around the crucible inner wall, and primary oscillations of the melt are triggered in said contact zone. On this basis, in order to provide a method characterized by reduced melt vibrations and in particular by a simple, short accretion process, according to the invention primary oscillations are triggered which differ from one another in their frequency.

26 Claims, 4 Drawing Sheets

(56) References Cited

U.S. PATENT DOCUMENTS

| | | |
|---|---|---|
| 7,686,887 B2 | 3/2010 | Ohama et al. |
| 7,909,931 B2 | 3/2011 | Saito et al. |
| 8,277,559 B2 | 10/2012 | Ohama |
| 2005/0235907 A1 | 10/2005 | Ohama et al. |
| 2006/0174651 A1 | 8/2006 | Ohama et al. |
| 2006/0236916 A1 | 10/2006 | Ohama |
| 2007/0062442 A1 | 3/2007 | Cho |
| 2007/0256628 A1 | 11/2007 | Saito et al. |
| 2009/0165700 A1 | 7/2009 | Kishi et al. |
| 2010/0319609 A1 | 12/2010 | Sato |
| 2012/0167624 A1 | 7/2012 | Sudo et al. |
| 2012/0255487 A1 | 10/2012 | Sudo et al. |
| 2012/0260852 A1 | 10/2012 | Sudo et al. |
| 2015/0267318 A1 | 9/2015 | Hünermann et al. |

FOREIGN PATENT DOCUMENTS

| | | |
|---|---|---|
| DE | 10 2010 021 694 A1 | 1/2011 |
| EP | 1024118 A2 | 8/2000 |
| EP | 1 045 046 A2 | 10/2000 |
| EP | 1532297 A1 | 5/2005 |
| EP | 2075355 A2 | 7/2009 |
| EP | 2 385 157 A1 | 9/2011 |
| EP | 2 410 081 A1 | 1/2012 |
| EP | 2 471 752 A2 | 7/2012 |
| JP | 2004250304 A | 9/2004 |
| JP | 2004250305 A | 9/2004 |
| JP | 2004292210 A | 10/2004 |
| JP | 2006169084 A | 6/2006 |
| JP | 2007191393 A | 8/2007 |
| JP | 2009029652 A | 2/2009 |
| JP | 2011037708 A | 2/2011 |
| WO | 0192609 A2 | 12/2001 |
| WO | 200192169 A1 | 12/2001 |
| WO | 2004013384 A1 | 2/2004 |
| WO | 2004076725 A1 | 9/2004 |
| WO | 2004097080 A1 | 11/2004 |
| WO | 2009054529 A1 | 4/2009 |
| WO | 2011 158712 A1 | 12/2011 |
| WO | 2014048791 A1 | 4/2014 |

OTHER PUBLICATIONS

Espacenet English Language Abstract, JP 2004 250304 A, published Sep. 9, 2004.

Espacenet English Language Abstract, JP 2007191393 A, published Aug. 2, 2007.

Espacenet English Language Abstract, JP 2004250305 A, published Sep. 9, 2004.

Espacenet English Language Abstract, JP 2006169084 A, published Jun. 29, 2006.

Espacenet English Language Abstract, JP 2009029652 A, published Feb. 12, 2009.

Espacenet English Language Abstract, JP 2011037708 A, published Feb. 24, 2011.

Espacenet English Language Abstract, DE 10 2007 015 184 A1, published Oct. 11, 2007.

Espacenet English Language Abstract, EP 1 045 046 A2, published Oct. 18, 2000.

Espacenet English Language Abstract, JP 2004 292210 A, published Oct. 21, 2004.

PULLING A SEMICONDUCTOR SINGLE CRYSTAL ACCORDING TO THE CZOCHRALSKI METHOD AND SILICA GLASS CRUCIBLE SUITABLE THEREFOR

RELATED APPLICATIONS

This application is a continuation application of U.S. patent application Ser. No. 14/430,868 having U.S. filing date Mar. 24, 2015 now U.S. Pat. No. 9,856,576, which was published on Sep. 24, 2015 as U.S. 2015/0267318 A1, herein incorporated by reference, and which was a U.S. national stage of international application serial number PCT/EP2013/069234 filed on Sep. 17, 2013 and published on Apr. 3, 2014 as WO 2014/048791 A1, which is herein incorporated by reference.

TECHNICAL BACKGROUND

The invention refers to a method for pulling a semiconductor single crystal according to the Czochralski method, in which a semiconductor melt is produced in a quartz glass crucible and the semiconductor single crystal is pulled therefrom, the quartz glass crucible comprising an inner wall and the semiconductor melt comprising a free melt surface which in the area of a contact zone extending radially circumferentially on the inner wall of the crucible are in contact with each other and with a melt atmosphere, respectively, wherein primary vibrations of the melt that start from the contact zone are initiated.

Furthermore, the invention refers to a quartz glass crucible to be used for pulling a semiconductor single crystal according to the Czochralski method.

In the so-called Czochralski method, semiconductor material, such as silicon, is molten in a quartz glass crucible and a seed crystal of a silicon single crystal is supplied from above to the melt surface, resulting in the formation of a melt meniscus between crystal and melt. The single crystal is slowly drawn off upwards under rotation of the crucible and/or the single crystal, the semiconductor single crystal growing on the seed crystal. This process shall be called "starting process" or shortly "starting" in the following. Interactions between liquid and solid phase take place on the solidification front between single crystal and semiconductor melt; these are impaired by convection or oscillation of the melt. These movements of the melt can be caused or intensified by temperature or substance gradients within the liquid, by rotation of melt and seed crystal or by immersion of the seed crystal. Particularly disadvantageous are oscillations of the melt. It is known that these occur whenever the chemical potential between the three phases semiconductor melt, melt atmosphere and crucible changes periodically.

Such oscillations impair not only the quality of the semiconductor single crystal. They are particularly disadvantageously noticed in the starting process as they aggravate nucleation and can delay or even impede the same by one to several days. This reduces productivity and can go so far that the life of the quartz glass crucible is already exceeded in the starting process, or that dislocations are produced in the single crystal that require a re-melting of the solidified silicon.

The quartz glass crucibles used in the Czochralski method are normally provided with a transparent inner layer on an opaque outer layer which contains pores. In the crystal pulling process the transparent inner layer is in contact with the silicon melt and is subject to high mechanical, chemical and thermal stresses. To reduce the corrosive attack of the silicon melt and, together with this, the release of impurities from the crucible wall, the inner layer is as pure as possible and homogeneous and has hardly any bubbles.

The inner layer of synthetically produced quartz glass ensures a low concentration of impurities in the region near the melt and has in this respect an advantageous effect on the yield of pure and dislocation-free semiconductor single crystal. However, it has been found that crucibles with an inner layer of synthetic quartz glass as compared with quartz glass crucibles produced from naturally occurring quartz sand rather tend to cause oscillations of the melt surface.

PRIOR ART

Thus many different changes on the quartz glass crucible have been suggested for reducing oscillations of the melt surface. These are substantially modifications of the surface structure or the chemical composition in the region of the starting zone.

"Starting zone" means here and hereinafter the circumferentially extending sidewall portion of the quartz glass crucible which at the beginning of the crystal pulling process is positioned at the height of the melt level, which is thus in contact with the surface of the melt (melt level) while the crystal is being pulled. In continuous Czochralski pulling methods in which the melt level is kept at a constant height by continuous supply of semiconductor material, the starting zone is positioned at the height of the time-constant melt level.

Modifications of the Surface in the Region of the Starting Zone

DE 199 17 288 C2 describes a quartz glass crucible in which the starting zone is roughened by way of multiple depressions which are spaced apart at a distance of not more than 5 mm, preferably not more than 0.1 mm. The roughening operation is to facilitate the starting process and is particularly meant to avoid a tearing off of the seed crystal by damping vibrations of the melt level.

It is intended in a melt crucible of quartz glass according to EP 1 045 046 A2 that the inner wall is configured in the area of the starting zone as a circumferentially extending ring surface with multiple depressions. A similar teaching is imparted in EP 2 410 081 A1. A great number of small indentations (depressions) are here provided in the starting zone.

According to WO 2011/158712 A1 the quartz glass crucible comprises a semitransparent base layer and a transparent inner layer. In the region of the melt level, the inner layer has a rough zone with a roughness in the range of 2-9 μm.

JP 2007-191393 A suggests the setting of a surface tension of not more than 50 mN/m through the roughness of the inner surface on the inner wall of the quartz glass crucible in order to avoid melt vibrations.

The roughened surface around the region of the starting zone may enclose all possible contact angles with the silicon melt, which prevents an in-phase wetting or non-wetting of the quartz glass surface and is thereby meant to counteract the creation of vibrations.

In the quartz glass crucible according to JP 2004-250304 A, a circumferentially extending ring surface is provided at the height of the starting zone for suppressing vibrations of the silicon melt, the ring surface containing bubbles with a percentage by volume of 0.01% to 0.2%.

To avoid melt vibrations at the beginning of the melt process, WO 2009/054529 A1 suggests a variation of the bubble concentration along the crucible height. Hence, the bubble content of the inner layer is to increase from the lower crucible region upwards continuously with at least 0.0002%/mm.

A similar modification of the inner layer of the quartz glass crucible is also suggested in JP 2004-250305 A. In the area of the starting zone the inner layer contains a "belt-like" portion in which the surface consists of natural quartz glass and has a bubble content of 0.005-0.1%, whereas further down and on the bottom it consists of synthetic quartz glass.

A multiple modification in the area of the starting zone is taught in EP 2 385 157 A1. Thus the quartz glass crucible is provided on the inside with markings used for determining changes in the position of the melt surface. In the region of the starting zone the transparent inner layer is made from natural quartz glass, whereas it consists of synthetic quartz glass in the other regions of the crucible. Moreover, the starting zone may also contain bubbles or irregularities, such as slots.

Modifications in the Chemical Composition in the Region of the Starting Zone

EP 1 532 297 A1 discloses a quartz glass crucible which comprises a transparent inner layer of synthetic quartz glass which, however, at the height of the starting zone is interrupted by a zone of naturally occurring quartz glass. This zone extends within a range of at least 0.5×H to 0.8×H, wherein H is the crucible height between the lower side of the bottom and the upper edge of the sidewall.

WO 2001/92169 A1 suggests that hydroxyl groups should be incorporated into the quartz glass of the inner layer of the crucible. This improves the wettability thereof with the silicon melt, whereby oscillations on the melt surface are to be avoided. The hydroxyl groups are incorporated during the formation of the inner layer by introducing water vapor into the heated atmosphere. Preferably, this produces a hydroxyl group content of 80-350 wt. ppm in the inner layer.

WO 2004/097080 A1 suggests the suppression of melt vibrations by varying the composition of the inner layer of the crucible along the crucible height. The quartz glass crucible with non-transparent outer layer is produced from natural quartz powder, and this layer is provided with a transparent inner layer which has a thickness of 0.4-5 mm and which in the upper part consists of a natural $SiO_2$ material and in the bottom portion of synthetic $SiO_2$ material.

JP 2006-169084 A also recommends the suppression of melt vibrations by varying the composition of the inner layer of the crucible in the region of the starting zone. The quartz glass crucible has an opaque outer layer and a transparent inner layer. In the upper straight part the inner layer is configured as a composite consisting of two different components, the second component being welded in a dotted manner to the first component. The first component may be an amorphous quartz glass powder and the second one is natural crystalline quartz sand.

According to JP 2009-029652 A, in a quartz glass crucible for pulling silicon single crystals, for avoiding melt vibrations the bottom and the inner layer in the curved region between cylindrical sidewall are fused at a thickness of at least 1 mm from crystalline start material, whereas the upper region of the inner layer is produced at a thickness of at least 1 mm from amorphous synthetic quartz-glass powder.

Combinatory Measures and Other Modifications

JP 2011-037708 A1 describes a method for producing a quartz glass crucible for pulling a silicon single crystal, wherein the surface tension between silicon melt and quartz glass of the inner wall of the crucible is influenced for preventing vibrations of the melt during crystal pulling. This is done by setting the surface roughness and in that in a layer of a thickness of 1 mm the hydroxyl group content and the impurity content are set to defined values.

EP 1 024 118 A2 suggests the suppression of melt vibrations by setting a specified IR transmittance. To this end a transparent inner layer is produced on a translucent outer layer with structural defects. The IR transmittance is between 3% and 30% and is set by the structural defects within the crucible wall in combination with the roughness of the surface.

WO 2001/92609 A2 aims at suppressing oscillations of the silicon melt by reducing thermal convection. To achieve this, a quartz glass crucible with a sandwich layer is suggested. The outer layer is a translucent layer with a great number of pores, produced from natural raw quartz materials. The intermediate layer is also translucent and is produced from synthetic quartz glass. The transparent inner layer has hardly any bubbles and is made from synthetic quartz glass.

According to WO 2004/076725 A1 a quartz glass crucible with a double-layered structure is said to be of help, wherein the inner layer is without pores and transparent and the outer layer contains pores. The outer layer is made from quartz glass powder which was kept in a dry gas for achieving a hydroxyl group content of not more than 50 ppm. As a result, the outer layer also exhibits an increased viscosity, and the quartz glass crucible is thereby less deformed during use.

According to JP 2004-292210 A the quartz glass crucible is optimized such that during silicon single crystal pulling the temperature at the lower end is higher than at the top upper edge. To achieve this, a crystallization promoter is used in the inner layer, said promoter being varied over the height of the quartz glass crucible such that during use of the crucible the crystallization rate is reduced in the bottom region and increased in the upper region, which is to reduce melt vibrations.

The quartz glass crucible known from DE 10 2007 015 184 A1 has an opaque outer layer and a transparent inner layer, wherein the transparent inner layer is thicker in the region of the starting zone than in the remaining quartz-glass crucible.

EP 2 075 355 A1 suggests a high density of brown rings on the inner wall of the crucible in the Si pulling process for avoiding melt vibrations.

US 2007/0062442 A1 is concerned with the control of the oxygen content of the Si melt. In one embodiment, an asymmetrical crystal growth is aimed at by way of forced melt convection. This is e.g. achieved in that in a specific region of the silicon melt a magnetic field is produced, whereby melt convection occurs in the heating element that is next to the single crystal to be pulled.

TECHNICAL OBJECT

Melt vibrations in the Czochralski method and particularly during the starting process still pose a technical problem which has not satisfactorily been solved yet despite all proposals made and measures taken over a period of more than 20 years.

It is therefore the object of the present invention to indicate a method for pulling a semiconductor single crystal from a quartz glass crucible that is distinguished by reduced melt vibrations and particularly by a simple and short starting process.

Furthermore, it is the object of the present invention to provide a quartz glass crucible which is suited for use in the pulling method by reliably suppressing or reducing melt vibrations and thereby facilitating the single-crystal pulling process.

GENERAL DESCRIPTION OF THE INVENTION

As for the method, this object starting from a method of the aforementioned type is achieved according to the invention by initiating primary vibrations that differ from one another in their frequency.

The amplitude of the melt vibrations may be in the cm range. The known reduction measures aim at varying one or several characteristics through the height of the inner wall of the crucible, particularly within the height range of the starting zone, wherein the rotation symmetry of the quartz glass crucible is maintained on the whole. Together with this, a rotation-symmetrical distribution of the characteristics of relevance to the creation of melt vibrations is maintained, so that, viewed over the crucible circumference, primary vibrations with the same frequency can superpose one another into a more or less coherent and resonance-capable vibration of the melt, which continues up and into the central region of the melt crucible and causes tear-off or changes in the structure of the single crystal at that place.

By contrast, it is suggested in the present invention for the first time that primary vibrations should be enforced having a frequency locally varying along the circumferentially extending contact zone. It is here important that an initiation of primary vibrations of the same frequency and thus of resonance-capable vibrations is suppressed along the contact zone or at least diminished to such an extent that no fixed-phase relation can evolve during superposition.

Along the circumference of the contact zone, a rotation symmetry is thereby avoided in the case of at least one characteristic of relevance to the melt oscillator, namely a characteristic which has an impact on the frequency of the primary vibrations.

Due to the prevention of the rotation symmetry a resonance-capable vibration of the semiconductor melt with fixed phase relationship can thus not build up around the contact zone. In other words, the primary vibrations arising at different places of the circumferentially extending contact zone show a different frequency. As a consequence, this will not lead to a constructional interference between the individual primary vibrations, so that the melt level in the middle region of the melt crucible stays calm, and the risk of a tearing off of the seedling or impairment of the structure of the single crystal is thereby reduced.

It is essential that the variation of the frequency of the primary vibrations takes place at the contact point between the three phases solid (inner wall of the crucible), liquid (semiconductor melt) and gas (melt atmosphere), i.e. along the radially circumferentially extending contact zone. The effect is the more pronounced, the greater the difference between maximal and minimal vibration frequency is. A variation in the vibration frequency of 5% (based on the maximal vibration frequency) already shows a considerable calming of the melt oscillation.

The frequency of the primary vibrations is varied in the preferred case in that the inner wall of the crucible, the melt atmosphere and/or the semiconductor melt along the radially circumferentially extending contact zone shows a variation in at least one of its physical, chemical or corporeal characteristics.

This avoids the formation of rotation symmetry in at least one characteristic of the quartz glass crucible itself, which characteristic is of relevance to the melt oscillation, or of the liquid or gaseous media in the surroundings of the contact zone. To achieve this, the characteristic in question is varied along the radially circumferentially extending contact zone between semiconductor melt, quartz glass crucible and melt atmosphere. Due to the prevention of the rotation symmetry, it is not possible to build up a resonance-capable vibration of the semiconductor melt with fixed phase relationship around the contact zone.

The characteristic in question is varied at the contact point between the three phases solid (inner wall of the crucible), liquid (semiconductor melt) and gas (melt atmosphere), more exactly, along the radially circumferentially extending contact zone. The characteristic is of a physical, chemical or corporeal nature and is assigned to one or more of the three aforementioned phases. As a rule, it suffices that a single characteristic of relevance is varied radially locally.

As for the radial variation of the inner wall of the quartz glass crucible, its geometric shape (radius of curvature), its chemical composition or the surface quality are e.g. under consideration. However, the method according to the invention is also efficient if a characteristic of the two other phases is radially varied with impact on the vibration behavior of the melt. This primarily regards those properties that influence the surface tension, such as temperature or chemical composition of the melt atmosphere.

The longitudinal section within which the characteristic in question is changed extends over the whole circumference of the contact zone or over a part thereof. In the simplest case the characteristic assumes a first state and a second state, wherein the variation of the characteristic along the circumferentially extending contact zone is such that the first state and the second state are alternating.

In this procedure, the rotation symmetry of the circumferentially extending contact zone is avoided by way of local changes in the characteristic in question by changing the degree of its formation between the first and second state at least once, preferably repeatedly. The first state of the characteristic can be regarded as a basic state, and the second state marks a deviation from the basic state. The local changes in the basic state are uniformly distributed over the length of the contact zone, but preferably irregularly.

The respective changes in the characteristic have an impact on the vibration behavior of the semiconductor melt that is the more pronounced the greater the difference between the first and second state is, and the greater the length portion around the contact zone, which is to be assigned to the changed second state.

It has here turned out to be useful when the characteristic assumes its second state over at least a tenth, preferably over at least a third, of the circumferential length of the contact zone.

In an alternative and equally suitable procedure the characteristic assumes a first state and a second state, wherein the variation of the characteristic along the circumferentially extending contact zone is such that it is changing from the first state step by step or gradually to the second state.

The rotation symmetry of the circumferentially extending contact zone is avoided by a gradual change in the characteristic in question by gradually changing the degree of its formation between the first and second state step by step or gradually.

The respective changes in the characteristic have an impact on the vibration behavior of the semiconductor melt that is all the more pronounced the greater the difference between first and second state is, and the greater the length portion around the contact zone where the change in the characteristic takes place.

In this connection it has turned out to be useful when the stepwise or gradual change from the first to the second state of the characteristic extends over at least one tenth, preferably over at least one third, of the circumferential length of the contact zone.

In the simplest case the characteristic which varies along the circumferentially extending contact zone is the chemical composition of the melt atmosphere and/or the temperature thereof.

Composition and temperature of the melt atmosphere are parameters of the single crystal pulling process that have a considerable influence on the surface tension in the region of the contact zone and thus also on the vibration behavior of the melt. Hence, the rotation symmetry of a characteristic of relevance to the melt oscillation is disturbed by a radial variation of these parameters around the contact zone. A variation of the chemical composition is e.g. carried out by a gas stream locally acting on the contact zone and having a composition which differs from that of the melting crucible atmosphere. A local change in the temperature is also adjustable by way of a gas stream which has a temperature different from that of the melting crucible atmosphere and which is oriented preferably directly onto a section of the contact zone.

As an alternative or as a supplement thereto, the characteristic which varies along the circumferentially extending contact zone is the internal structure, the chemical composition, the surface condition and/or the temperature of the inner wall of the crucible.

The internal structure, the chemical composition, the surface condition and the temperature of the crucible wall are also parameters that have a considerable influence on the surface tension in the region of the contact zone and thus also on the vibration behavior of the melt. According to the invention a variation of one or several of said parameters is intended, namely in radial direction, along the circumferentially extending contact zone. This also disturbs the rotation-symmetrical profile of the characteristic which is of relevance to the melt oscillation.

Here, a variation of the chemical composition is preferably carried out by way of the hydroxyl group content of the quartz glass of the inner wall of the crucible by varying the same between a maximal concentration $C_{OH,max}$ and a minimal concentration $C_{OH,min}$ along the circumferentially extending contact zone.

The effect regarding the suppression of resonance-capable vibrations of the semiconductor melt with fixed relationship is the more pronounced the more distinct the difference between $C_{OH,max}$ and $C_{OH,min}$ is, and the greater the length section of the contact zone, over which the variation extends. In this respect it has turned out to be useful when the minimal concentration $C_{OH,min}$ is less than 80%, preferably less than 60%, of the maximal concentration $C_{OH,max}$.

As an alternative or supplement thereto, the chemical composition in the area of the contact zone is defined by the type of the quartz glass for the inner wall of the crucible which is either synthetically produced quartz glass or quartz glass produced from naturally occurring raw material or is a mixture of said quartz glass types, and that the concentration of the quartz glass types along the circumferentially extending contact zone varies at least once.

Quartz glass of naturally occurring raw material and synthetically produced quartz glass are different types of quartz glass. Their variation over the height of the crucible wall is sufficiently known from the prior art. By contrast, according to the present invention there is a variation of the proportions of quartz glass of naturally occurring raw material and of synthetically produced quartz glass in circumferential direction, namely at least at the height of the circumferentially extending contact zone. It is thus reproducibly possible to reduce a rotation-symmetrical characteristic distribution and an accompanying risk of a resonance-capable and intensifying melt oscillation.

As an alternative or supplement to the chemical composition, the surface condition of the inner wall of the crucible is varied along the circumferentially extending contact zone. A variation of the surface condition is here preferably carried out by changing the roughness of the surface. To this end a value determined over a measurement length of 1 cm for the mean surface roughness $R_a$ of the inner wall of the crucible is defined, the mean surface roughness varying between a maximum value $R_{a,max}$ and a minimum value $R_{a,min}$ along the circumferentially extending contact zone. The roughness is locally changed, for instance by scratches, dents or an open porosity of the quartz glass.

In this case, too, the effect as regards the suppression of resonance-capable vibrations of the semiconductor melt with fixed relationship is the more pronounced, the more distinct the difference between $R_{a,max}$ and $R_{a,min}$ is and the greater the length section of the contact zone over which the variation extends. Ideally, the minimum value $R_{a,min}$ is less than 80%, preferably less than 60%, of the maximum value $R_{a,max}$.

In the case of an open porosity, e.g. a smooth, dense inner wall with a minimum value $R_{a,min}$ near zero may be interrupted by portions of an open porosity. However, length sections with a different open porosity may be alternating along the contact zone, or the open porosity is changing over the length of the contact zone (or a part of said length) gradually or step by step between $R_{a,min}$ and $R_{a,max}$.

As an alternative or a supplement thereto, the internal structure of the inner wall of the crucible varies along the circumferentially extending contact zone in that the bubble content of the quartz glass is locally changed. To this end, a value determined over a measurement length of 1 cm is defined for the bubble content of the quartz glass within the inner wall of the crucible, wherein the bubble content varies between a maximum value $P_{max}$ and a minimum value $P_{min}$ along the circumferentially extending contact zone.

The frequency of primary vibrations is here primarily influenced by the amount of closed bubbles which is directly underneath the closed surface in the region of the contact zone. Just for the purpose of clarification, "bubble content" in this sense defines the percentage by volume of closed bubbles found down to a depth of 1 cm underneath the inner wall of the crucible. The bubble content can be determined by counting. In the simplest case a transparent, bubble-free content with a minimum value $P_{min}$=zero is interrupted by portions having a higher bubble content. However, length sections with different bubble content along the contact zone may be alternating, or the bubble content is changing over the length of the contact zone (or part of the length thereof) gradually or step by step between $P_{max}$ and $P_{min}$.

It has turned out to be advantageous when the minimum value $P_{min}$ is less than 50%, preferably less than 30%, of the maximum value $P_{max}$.

The surface condition and/or the chemical composition of the inner wall preferably changes within a circumferentially extending variation band which is running from the contact zone over a width of at least 5 mm, preferably at least 10 mm, in the direction of a crucible bottom.

As for the excitation of vibrations in the semiconductor melt and the adjustment of the vibration frequency, particularly the portion of the crucible wall that is in contact with the melt, i.e., the wall portion underneath the contact zone, is of decisive importance, apart from the contact zone proper. Therefore, a variation of the surface characteristic in question is also preferably intended in this wall portion.

As for the quartz glass crucible to be used for pulling a semiconductor single crystal according to the Czochralski method, the above-indicated object starting from a quartz glass crucible of the aforementioned kind is achieved according to the invention in that it comprises an inner wall of the crucible along which a radially circumferentially extending contact zone is provided which shows a variation in at least one of its physical, chemical or corporeal characteristics.

In the quartz glass crucible according to the invention and in contrast to the prior art, an annulment of the rotation symmetry with respect to at least one characteristic of relevance to the melt oscillation is intended. To achieve this goal, a physical, chemical or corporeal characteristic of the quartz glass crucible is varied along a radially circumferentially extending contact zone. The contact zone conforms here to the starting zone according to the above-indicated definition. Due to the annulment of the rotation symmetry, a resonance-capable vibration of the semiconductor melt with fixed phase relationship cannot build up during the intended use of the quartz glass crucible. The reason is that due to the non-rotation-symmetrical formation of the characteristic in question, the vibrations created at different places of the circumferentially extending contact zone exhibit a different frequency. As a result, there will be no constructive interference between the individual primary vibrations, so that the melt level in the central region of the melt crucible remains calm, and the risk of a tearing off of the seedling or impairment of the structure of the single crystal is reduced.

It is essential that the characteristic in question is varied at the contact point between the three phases solid (crucible inner wall), liquid (semiconductor melt) and gas (melt atmosphere), to be more exact, along the radially circumferentially extending contact zone. It is not required, but does also not present an obstacle, if the variation on the crucible wall is continued upwards or downwards.

The characteristic is of a physical, chemical or corporeal nature and is to be assigned to one or several of the three phases mentioned. As a rule, it suffices to radially vary a single relevant characteristic.

For the radial variation of the inner wall of the quartz glass crucible its geometrical shape, its chemical composition or the surface condition are e.g. of relevance. The length section within which the characteristic in question is changed extends over the whole circumference of the contact zone or over a part thereof. The quartz glass crucible according to the invention is particularly suited for use in the method according to the invention.

Advantageous developments of the quartz glass crucible according to the invention follow from the sub-claims. Insofar as developments of the crucible indicated in the sub-claims conform to the procedures indicated in the sub-claims with respect to the method according to the invention, reference is made for a supplementary explanation to the above description of the corresponding method claims.

EMBODIMENT

The invention will now be explained in more detail with reference to embodiments and a drawing. In a schematic illustration, FIG. 1 shows a crystal pulling system for performing the single-crystal pulling method according to the invention;

Figure 1:
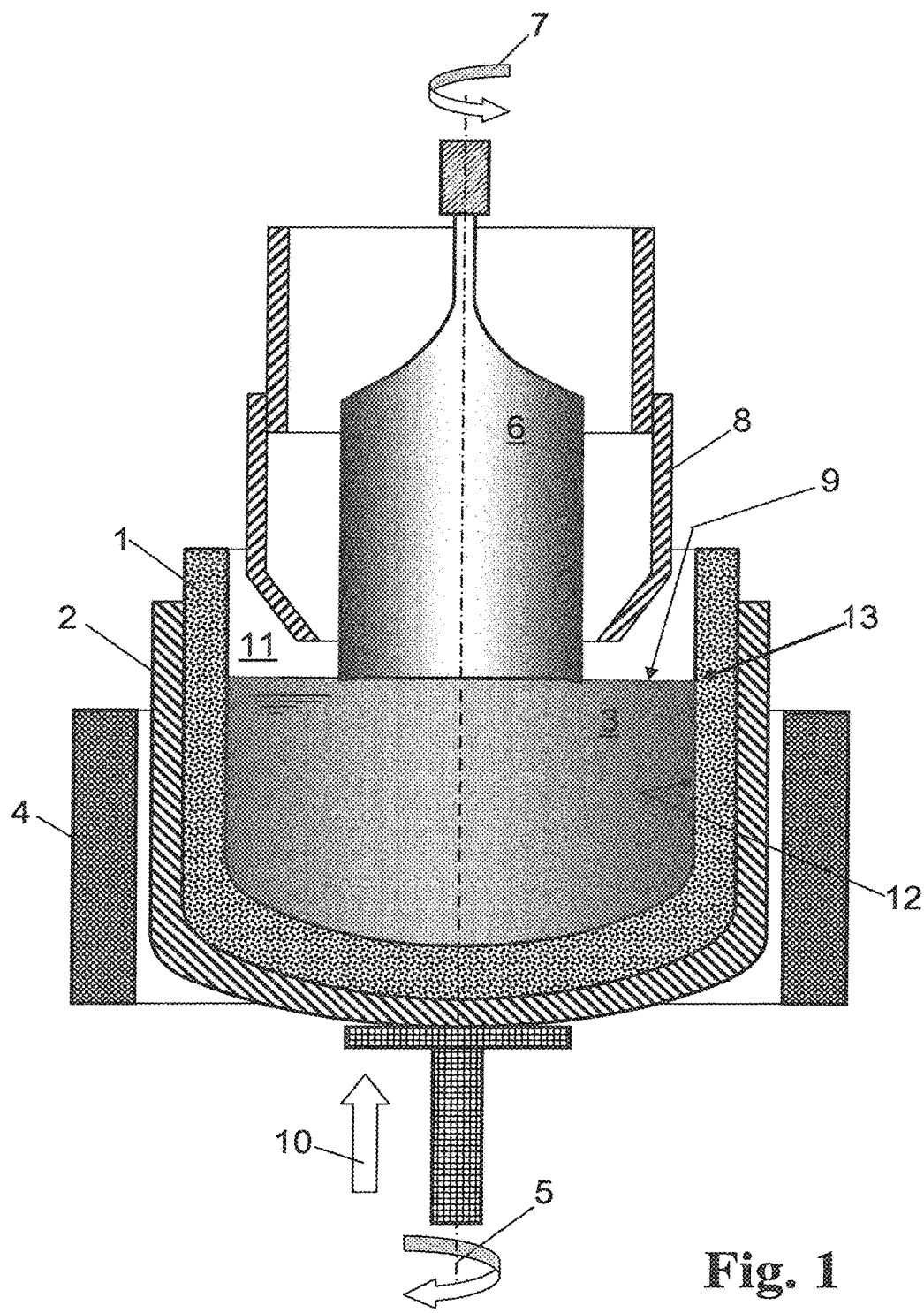

FIG. 1 schematically shows a single-crystal pulling device. It comprises a quartz glass crucible 1 which is stabilized by a support crucible 2 and which contains a silicon melt 3 which is kept at melt temperature by a heater 4 provided laterally on the crucible wall.

The quartz glass crucible 1 is rotatable about a rotation axis 5. The silicon single crystal 6 is pulled upwards out of the melt 3 and is rotated in this process in opposite direction with respect to the crucible 1, as indicated by the directional arrow 7.

The single crystal 6 which is pulled upwards is surrounded by a heat shield 8. Argon is continuously supplied through the gap between heat shield 8 and single crystal 6, the argon forming the melt atmosphere 11 within the pulling chamber (not shown in the figure) and serving gas-flushing purposes.

The melt surface 9 in the quartz glass crucible 1 is kept at a constant level in the course of the pulling process. For this purpose the quartz glass crucible 1 follows in upward direction, as shown by the directional arrow 10. At this position, which is here called contact zone 13, the inner wall 12 of the quartz glass crucible 1, the silicon melt 3 and the melt atmosphere 11 are thus in direct contact with one another.

The invention aims at varying—at least in the region of the contact zone 13—a characteristic of the surface of the inner wall 12 of the quartz glass crucible in radially circumferentially extending direction. The radially varying surface characteristic is e.g. the hydroxyl group, the surface roughness, the bubble content, or quartz glass quality in the sense that this is quartz glass of naturally occurring or of synthetically produced start material.

FIGS. 2 to 5 schematically show suitable quartz glass crucibles with radially circumferentially extending profiles of a surface characteristic. The characteristic is varied at the height of the radially circumferentially extending line of the contact zone 13 which in this case corresponds to the height of the starting zone.

A coordinate plane in which the extent of the formation or the concentration K of the respective surface characteristic is plotted against the circumferential length L of the contact zone 13 is respectively laid over the view on the inner wall 12 of the crucible in the figures, with the figures only showing half of the total circumference.

The ordinate value 100 of K corresponds to the useful or technologically feasible maximum value of the characteristic in question in its formation A; and the ordinate value 0 of K symbolizes the useful or technologically feasible minimum value of the characteristic in question in its formation A or the technologically feasible or useful value of the characteristic in question in its formation B.

If the surface characteristic is the hydroxyl group content of the quartz glass, this content varies expediently between 80 wt. ppm (minimum value) and 150 wt. ppm (maximum value).

If the surface characteristic is the surface roughness $R_a$ of the inner value, this value varies between 5 μm (minimum value) and 200 μm (maximum value). The value for the surface roughness is determined according to DIN 4768 as a mean roughness depth $R_a$.

If the surface characteristic is the bubble content of the quartz glass within the crucible wall in the region of the contact zone 13, it will vary between 0.01% (minimum value) and 0.03% (maximum value), namely as a mean value, measured over a layer thickness of 2 mm.

In the case of the quartz glass quality the surface characteristic varies between quartz glass of naturally occurring start material and quartz glass of synthetically produced start material.

Figure 2:
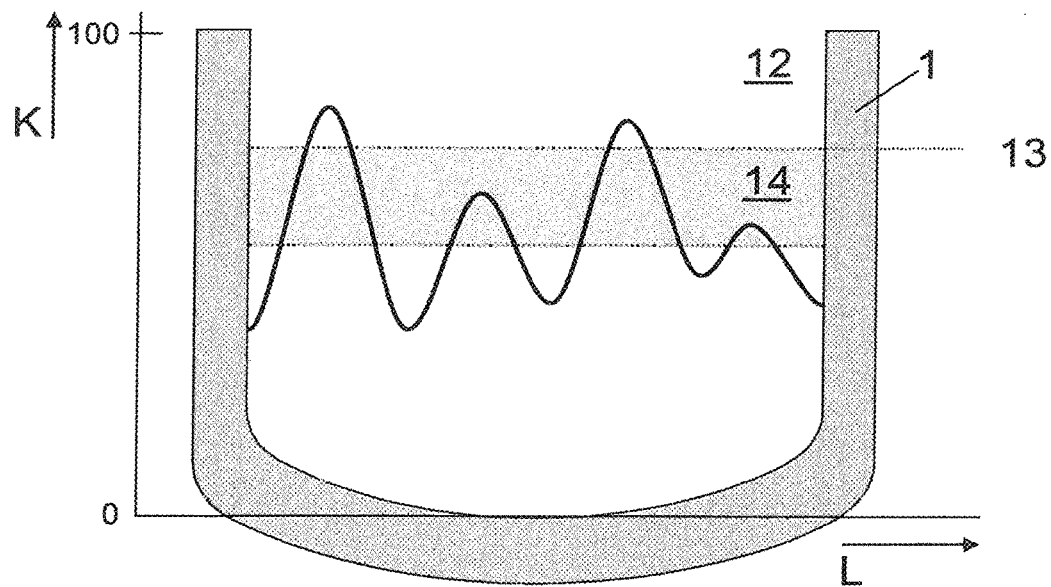
FIG. 2 shows a first embodiment of the quartz glass crucible according to the invention in section in a view on the inner wall, which shows an annular contact zone with a surface characteristic of a high-frequency variation in circumferential direction.

In the embodiment shown in FIG. 2, the surface characteristic varies around the contact zone 13, as indicated by the profile. The same profile or at least a profile similar to the illustrated profile is also found in a certain surface area of the inner wall 12 of the crucible underneath the contact zone 13. This surface area, which is called "variation band" 14, is visible in the diagram as an area with a gray background. In the embodiment the variation band 14 extends from the contact zone 13 approximately 30 mm downwards in the direction of the crucible bottom.

The formation/concentration K of the surface characteristic varies within the contact zone 13 (or within the radial circumferential course of the variation band 14) irregularly, but constantly. The variation width of the change only corresponds to a small range of the total possible scale of K. The radially circumferentially extending profile of K shows a plurality of relative maxima and minima which define a mean variation frequency (distance of maximum to maximum) of about 0.04 cm$^{-1}$.

Figure 3:
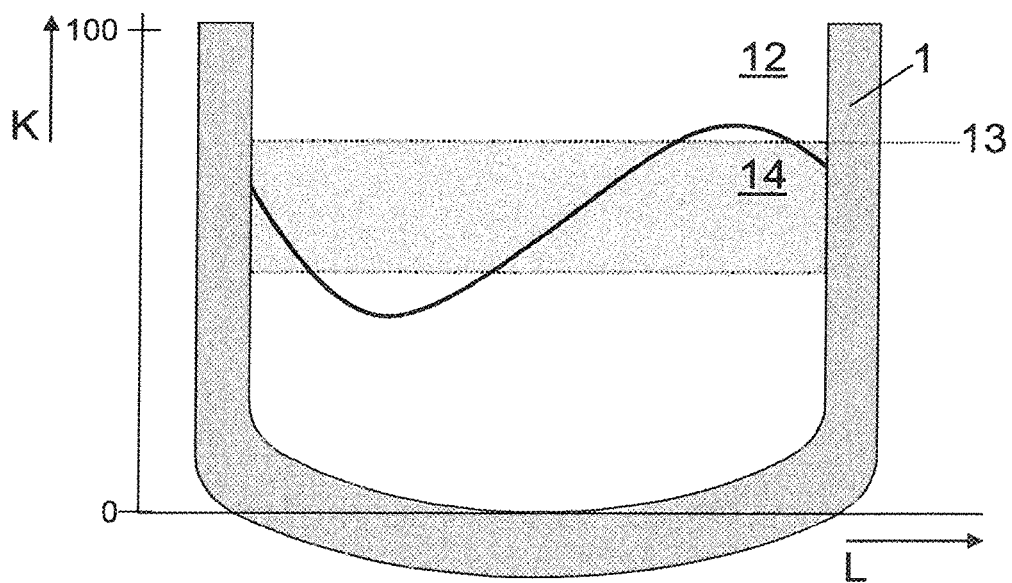
FIG. 3 shows a second embodiment of the quartz glass crucible according to the invention in section in a view on the inner wall, which shows an annular contact zone with a surface characteristic of a low-frequency variation in circumferential direction.

In contrast to FIG. 2, in the embodiment shown in FIG. 3, the surface characteristic within the contact zone 13 or within the variation band 14 having a width of 50 mm varies almost regularly sinusoidally and at a much lower frequency of about 0.014 cm$^{-1}$, but also only in a small range of the total scale of K.

The profiles shown in FIGS. 2 and 3 are particularly suited for radially circumferentially extending variations of the hydroxyl group content of the quartz glass and the surface roughness and the bubble content of the inner wall of the crucible.

Figure 4:
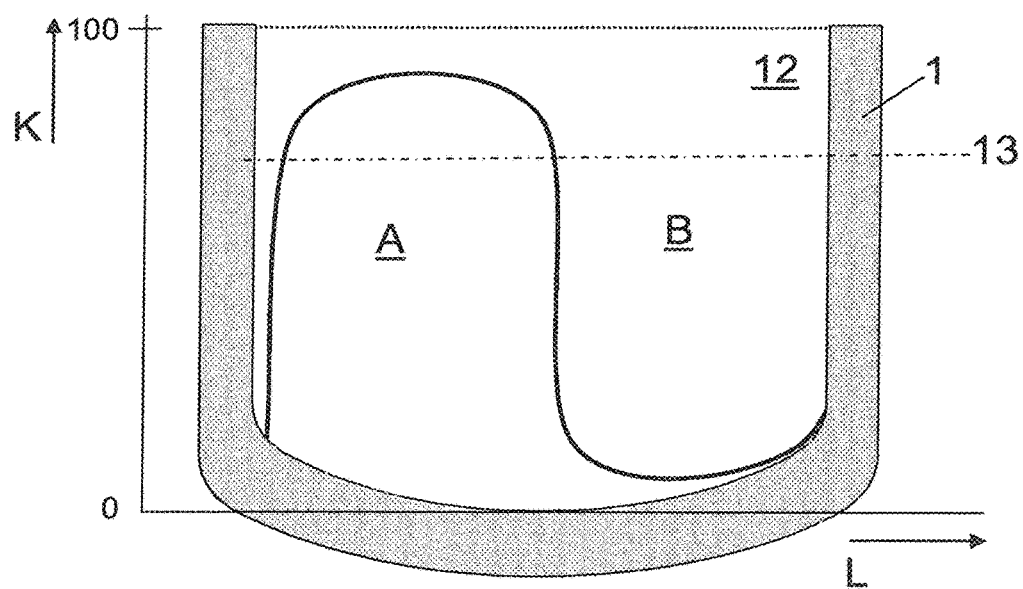
FIG. 4 shows a first embodiment of the quartz glass crucible according to the invention in section in a view on the inner wall, over the whole height of which a surface characteristic varies and which has several maxima and minima, viewed in circumferential direction.

In the embodiment shown in FIG. 4, the surface characteristic of the inner wall of the crucible varies not only circumferentially around the contact zone 13, but simultaneously over almost the whole height of the inner wall of the crucible in a similar way. The outlined contact zone 13 also corresponds here to the maximal height of the melt level (=height of the starting zone) at the beginning of the single-crystal pulling method. The variation width corresponds here to almost 100% of the whole scale of K, which means that the characteristic in question varies almost completely between its two formations A and B or between the above-defined minimum and maximum values.

Figure 5:
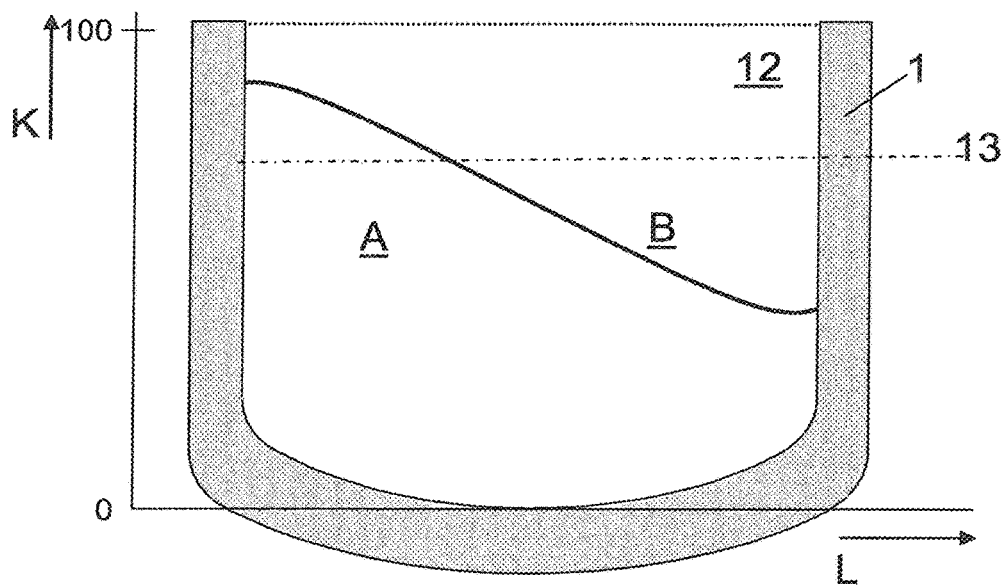
FIG. 5 shows a further embodiment of the quartz glass crucible according to the invention in section in a view on the inner wall, over the whole height of which a surface characteristic varies and which has a maximum and a minimum, viewed in circumferential direction.

Similar to the profile of FIG. 4, in the embodiment shown in FIG. 5 the surface characteristic also varies between two formations A and B of the characteristic. Here, however, a continuous gradual transition from the one to the other formation takes place over the whole radial circumference, the concentration profile K having only one maximum and only one minimum in each formation. Hence, only two gradual changes take place over the circumference of the inner wall, namely a gradual change from formation A to B over a half of the circumferential length and a gradual change from formation B to A over the other half of the circumferential length.

The change profiles of FIGS. 4 and 5 are particularly useful for radially circumferentially changing the composition of the inner wall of the crucible between sections of quartz glass of naturally occurring start material and sections of quartz glass of synthetically produced start material. They are however equally suited for radially circumferentially extending variations of the hydroxyl group content of the quartz glass and the surface roughness and the bubble content of the inner wall of the crucible.

The manufacture of a quartz glass crucible according to the invention shall now be explained in more detail with reference to an embodiment and with reference to the melt apparatus shown in FIG. 6. The hydroxyl group content of the quartz glass is here varied along a radially circumferentially extending contact zone of the inner wall of the crucible.

Figure 6:
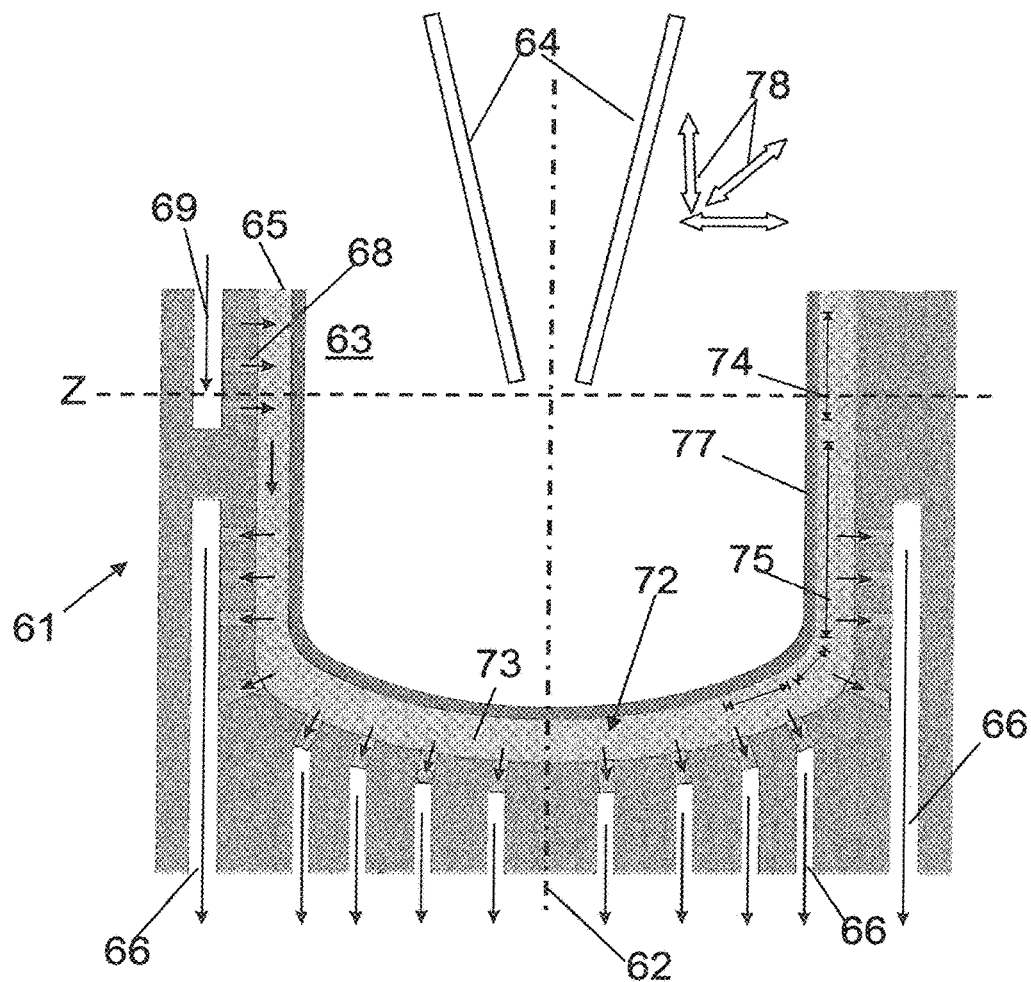
FIG. 6 shows an apparatus for producing a quartz glass crucible according to the invention.

The crucible type melt apparatus which is diagrammatically shown in FIG. 6 comprises a melt mold 61 of metal with an inner diameter of 78 cm, a curved bottom and a sidewall with a height of 50 cm. The melt mold 61 is supported to rotate about its central axis 62. Electrodes 64 of graphite which are movable inside the interior 63 in all spatial directions, as shown by the block arrows 78, project into the interior 53 of the melt mold 61.

A plurality of passages 66 through which a vacuum applied to the outside of the melt mold 61 can become operative in the interior 63 are provided in the bottom portion 73 and in the area of the lower wall half 75 of the melt mold 61. Further passages 68 through which a gas can be passed towards the melt mold interior 63 are provided in the upper wall third 74 of the melt mold 61. The passages 68 terminate in a joint groove 69 which is pierced from above into the one half of the upper side of the melt mold wall up to the height of the starting zone "Z" (corresponds to the height of the contact zone 13 during the intended use). The passages 66; 68 are each sealed with a plug of porous graphite which prevents SiO$_2$ granules from exiting out of the interior 63.

In a first method step, crystalline granules of natural quartz sand cleaned by hot chlorination are introduced into the melt mold 61. The quartz sand has a grain size ranging from 90 μm to 315 μm. Under the action of the centrifugal force and by using a template, a rotation-symmetrical, crucible-like grain layer 72 of mechanically compacted quartz sand is formed on the inner wall of the melt mold 61 rotating about the longitudinal axis 62. The layer thickness of the grain layer 72 is about the same in the bottom portion 73 and in the lower side portion 75 and in the upper side portion 74 and is about 25 mm. The height of the grain layer 72 in the sidewall portion corresponds to the height of the melt mold, i.e. 50 cm.

In a second method step, the electrodes 64 are positioned near the grain layer 72 in the melt mold 61 still rotating about its longitudinal axis 62, and an electric arc is ignited between the electrodes 64.

The electrodes 64 are powered with 600 kW (300 V, 2000 A) so that a high-temperature atmosphere is obtained in the melt mold interior 63. A skin layer 77 of dense transparent quartz glass with a thickness of about 0.5 mm is thereby produced on the quartz grain layer 72. The free upper side 65 of the grain layer 72 is thereby also densified.

After formation of the skin layer 77 a vacuum (100 mbar absolute pressure) is applied to the grain layer 72 in the bottom portion 73 and in the lower wall portion 75 in a third method step via the passages 66. At the same time, water vapor is introduced via the passages 68 into the one half of the still porous grain layer 72. The respective gas flows during suction and introduction of water vapor are outlined in FIGS. 1 to 3 by way of arrows.

Due to the flow resistance of the grain layer 72 the water vapor introduced at half the side is distributed substantially only in the one half of the grain layer 72 and also substantially only in the upper side portion 74 around the starting zone Z, so that in this portion of the grain layer the $SiO_2$ granules are relatively heavily loaded with water vapor.

During further vitrification under vacuum a melt front travels from the inside to the outside through the grain layer 72. Due to the stronger water loading in the one half of the grain layer 72 a vitrified zone is formed with a higher hydroxyl group content than in the other half.

As soon as the melt front is at a distance of about 4 cm from the melt front wall, evacuation is terminated. The rear side of the grain layer 72 thereby also vitrifies in the bottom and lower sidewall portion into opaque, bubble-containing quartz glass. Vitrification is stopped before the melt front reaches the melt mold 61.

Viewed over the circumference at the height of the starting zone Z, one achieves the greatest difference in the hydroxyl group content of the quartz glass between the area of the preceding air introduction (90 wt. ppm)—namely in the middle of the length of the groove 69—and the exactly opposite portion of the sidewall. It is 130 wt. ppm at that place. The OH group concentration profile obtained over the circumference of the starting zone Z is here equal to that of FIG. 5.

During the intended use of the quartz glass crucible the thin skin layer 77 dissolves within a short period of time. The free surface of the inner wall of the crucible that is then exposed is distinguished by hydroxyl groups having a concentration that at the height of the starting zone Z (=contact zone 13) varies in the radially circumferentially extending direction, as explained with reference to FIG. 5. As a consequence, a different surface tension is obtained for each point between silicon melt and crucible wall and thus different excitation conditions for oscillations, so that melt vibrations are suppressed.

As an alternative to the described method, a hydroxyl group content that is inhomogeneous along the contact zone, i.e. a locally different one, is produced by using a hydrogen-containing burner flame, for instance oxyhydrogen flame. The hydroxyl group content can be adjusted in a locally different way through the degree of the action (temperature and duration) of the burner flame. This method also permits the subsequent generation of a chemical variation of the chemical composition in the case of a quartz glass crucible having a homogeneous crucible wall.

The crucible melt apparatus shown in FIG. 6 is also suited for producing a contact zone 13 with a radially circumferential variation in the bubble content within the crucible wall. For this purpose, in the third method step a hardly soluble gas such as nitrogen or—in the embodiment—air is passed via the passages 68 into the one half of the still porous grain layer 72 instead of water, which is relatively easily soluble in quartz glass.

Due to the flow resistance of the grain layer 72 the air introduced at half the side is distributed substantially only in the one half of the grain layer 72 and also substantially only in the upper side portion 74 around the starting zone Z, so that in this area of the grain layer one obtains a relatively high concentration of hardly soluble nitrogen.

During further vitrification under vacuum a melt front travels from the inside to the outside through the grain layer 72. Due to the stronger nitrogen loading in the one half of the grain layer 72 a vitrified zone with a higher bubble content is formed in the one half of the grain layer 72 than in the other half.

Viewed over the circumference and at the height of the starting zone Z, one obtains the greatest difference in the bubble content between 0.01% in the area of the preceding air introduction—namely in the middle of the length of the groove 69—and the exactly opposite portion of the sidewall. It is 0.03% at that place. The bubble concentration profile obtained in this process over the circumference of the starting zone Z within the crucible wall resembles that of FIG. 5.

The invention claimed is:

1. A quartz glass crucible configured for use in for pulling a semiconductor single crystal according to the Czochralski method, said crucible comprising:
    an inner wall of the crucible having a circumferentially extending contact zone that has a variation in an at least one physical or chemical characteristic thereof,
    wherein said the characteristic which that varies along the circumferentially extending contact zone is the an internal structure,
    wherein the internal structure is defined as a bubble content of quartz glass of the inner wall of the crucible, said bubble content being determined over a measurement length of 1 cm, the bubble content varying between a maximum value $P_{max}$ and a minimum value $P_{max}$ along the circumferentially extending contact zone; and
    wherein the characteristic has a first state and a second state, and the variation of the characteristic along the circumferentially extending contact zone is such that the first state thereof and the second state thereof alternate.

2. The quartz glass crucible according to claim 1 wherein the characteristic has a first state and a second state, and the variation of the characteristic along the circumferentially extending contact zone is such that the characteristic changes step by step or gradually from the first state to the second state.

3. The quartz glass crucible according to claim 2, wherein the stepwise or gradual change from the first state to the second state of the characteristic covers at least a tenth of a circumferential length of the contact zone.

4. The quartz glass crucible according to claim 1, wherein the characteristic is in the second state over at least a tenth of a circumferential length of the contact zone.

5. The quartz glass crucible according to claim 1, wherein the internal structure of the inner wall varies within a circumferentially extending variation band that extends from the contact zone toward a crucible bottom and has a width of at least 5 mm.

6. The quartz glass crucible according to claim 5, wherein the stepwise or gradual variation from the first state to the second state of the characteristic covers at least a third of a circumferential length of the contact zone.

7. The quartz glass crucible according to claim 1, wherein the characteristic is in the second state over at least a third of a circumferential length of the circumferentially extending contact zone.

8. The quartz glass crucible according to claim 1, wherein the minimum value $P_{min}$ is less than 30% of the maximum value $P_{max}$.

9. The quartz glass crucible according to claim 1, wherein the minimum value $P_{min}$ is less than 50% of the maximum value $P_{max}$.

10. A quartz glass crucible configured for use for pulling a semiconductor single crystal according to the Czochralski method, said crucible comprising
    an inner wall of the crucible having a circumferentially extending contact zone that has a variation in an at least one physical or chemical characteristic thereof;
    wherein said characteristic that varies along the circumferentially extending contact zone is the chemical composition, and wherein the chemical composition includes a hydroxyl group content of quartz glass of the inner wall of the crucible, said hydroxyl group content varying between a maximal concentration $C_{OH,max}$ and a minimal concentration $C_{OH,min}$ along the circumferentially extending contact zone.

11. The quartz glass crucible according to claim 10, wherein the minimal concentration $C_{OH,min}$ is less than 80% of the maximal concentration $C_{OH,max}$.

12. The quartz glass crucible according to claim 10, wherein the minimal concentration $C_{OH,min}$ is less than 60% of the maximal concentration $C_{OH,max}$.

13. The quartz glass crucible according to claim 10, wherein the chemical composition of the inner wall varies within a circumferentially extending variation band that runs from the contact zone in the direction of a crucible bottom and has a width of at least 10 mm.

14. The quartz glass crucible according to claim 10, wherein the chemical composition of the inner wall varies within a circumferentially extending variation band that runs from the contact zone in the direction of a crucible bottom and has a width of at least 5 mm.

15. The quartz glass crucible according to claim 10, wherein the characteristic has a first state and a second state, and the variation of the characteristic along the circumferentially extending contact zone is such that the characteristic changes step by step or gradually from the first state to the second state.

16. The quartz glass crucible according to claim 15 wherein the stepwise or gradual change from the first state to the second state of the characteristic covers at least a tenth of a circumferential length of the contact zone.

17. The quartz glass crucible according to claim 10, wherein the characteristic has a first state and a second state, and the variation of the characteristic along the circumferentially extending contact zone is such that the first state thereof and the second state thereof alternate.

18. The quartz glass crucible according to claim 17, wherein the characteristic is in the second state over at least a tenth of a circumferential length of the contact zone.

19. A quartz glass crucible configured for use for pulling a semiconductor single crystal according to the Czochralski method, said crucible comprising
    an inner wall of the crucible having a circumferentially extending contact zone that has a variation in an at least one physical or chemical characteristic thereof,
    wherein said the characteristic which that varies along the circumferentially extending contact zone is the chemical composition and wherein the chemical composition of the inner wall of the crucible is that of synthetically produced quartz glass, quartz glass produced from naturally occurring raw material or a mixture of synthetically produced quartz glass and quartz glass produced from naturally occurring raw material, and
    variations in proportions of synthetically produced quartz glass and quartz glass produced from naturally occurring raw material in the inner wall result in the chemical composition of the quartz glass along the circumferentially extending contact zone varying at least once.

20. The quartz glass crucible according to claim 19, wherein the chemical composition of the inner wall varies within a circumferentially extending variation band that runs from the contact zone in the direction of a crucible bottom and has a width of at least 5 mm.

21. The quartz glass crucible according to claim 19, wherein the chemical composition of the inner wall varies within a circumferentially extending variation band that runs from the contact zone in the direction of a crucible bottom and has a width of at least 10 mm.

22. The quartz glass crucible according to claim 19, wherein the characteristic has a first state and a second state, and the variation of the characteristic along the circumferentially extending contact zone is such that the characteristic changes step by step or gradually from the first state to the second state.

23. The quartz glass crucible according to claim 22, wherein the stepwise or gradual change from the first state to the second state of the characteristic covers at least a tenth of a circumferential length of the contact zone.

24. The quartz glass crucible according to claim 19, wherein the characteristic has a first state and a second state, and the variation of the characteristic along the circumferentially extending contact zone is such that the first state thereof and the second state thereof alternate.

25. The quartz glass crucible according to claim 24, wherein the characteristic is in the second state over at least a tenth of a circumferential length of the contact zone.

26. The quartz glass crucible according to claim 1, wherein the characteristic is bubble content.

* * * * *